United States Patent
Lee

(10) Patent No.: US 6,865,123 B2
(45) Date of Patent: Mar. 8, 2005

(54) SEMICONDUCTOR MEMORY DEVICE WITH ENHANCED REPAIR EFFICIENCY

(75) Inventor: Byung-Jae Lee, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/746,523

(22) Filed: Dec. 24, 2003

(65) Prior Publication Data

US 2004/0218432 A1 Nov. 4, 2004

(30) Foreign Application Priority Data

Apr. 30, 2003 (KR) .................................. 10-2003-0027858

(51) Int. Cl.[7] .............................................. G11C 29/00
(52) U.S. Cl. ................ 365/200; 365/225.7; 365/189.05
(58) Field of Search ............................. 365/200, 225.7, 365/189.05

(56) References Cited

U.S. PATENT DOCUMENTS 4,757,474 A * 7/1988 Fukushi et al. ............. 365/200
5,272,672 A * 12/1993 Ogihara ...................... 365/200
5,386,386 A * 1/1995 Ogihara ...................... 365/200

* cited by examiner

Primary Examiner—Huan Hoang
(74) Attorney, Agent, or Firm—Blakely Sokoloff Taylor & Zafman

(57) ABSTRACT

There is provided a semiconductor memory device with an enhanced repair efficiency, in which a repair operation is performed without regard to the positions of defective unit cells when a detective cell is repaired using a redundant cell in a package state. The semiconductor memory device includes: a redundancy circuit including a plurality of redundant cells for replacing a defective normal cell, the redundant cells being activated in response to corresponding redundant cell select signals, wherein the redundancy circuit receives data in response to a repair signal and stores the data into the redundant cell selected by the redundant select signal; and a redundancy controller for activating the repair signal if the inputted addresses are repaired addresses, and for activating the redundant cell select signal for selecting one of the plurality of redundant cells according to lower-bit redundant cell select addresses corresponding to the number of the plurality of redundant cells.

7 Claims, 14 Drawing Sheets

| | WORD LINE ADDRESS INCLUDING DEFECTIVE BIT | | | | | | | | | | | | |
|---|---|---|---|---|---|---|---|---|---|---|---|---|---|
| | A12 | A11 | A10 | A9 | A8 | A7 | A6 | A5 | A4 | A3 | A2 | A1 | A0 |
| wl0 | 0 | 0 | 0 | 0 | 0 | 0 | 0 | 0 | 0 | 0 | 0 | 0 | 0 |
| wl1 | 0 | 0 | 0 | 0 | 0 | 0 | 0 | 0 | 0 | 0 | 0 | 0 | 1 |
| wl2 | 0 | 0 | 0 | 0 | 0 | 0 | 0 | 0 | 0 | 0 | 0 | 1 | 0 |
| wl3 | 0 | 0 | 0 | 0 | 0 | 0 | 0 | 0 | 0 | 0 | 0 | 1 | 1 |
| | PROGRAMMING A1 TO A12 CORRESPONDING TO ERROR | | | | | | | | | | | | X |

~50

| | DISTRIBUTION OF ERROR X-ADDRESS | POSSIBILITY OF REPAIRING DEFECTS |
|---|---|---|
| 2-BIT ERROR | 201(wl0), 202(wl0) | POSSIBLE |
| | 202(wl0), 203(wl1) | POSSIBLE |
| | 204(wl2), 205(wl3) | POSSIBLE |
| | 202(wl0), 205(wl3) | IMPOSSIBLE |
| | 203(wl1), 204(wl2) | IMPOSSIBLE |

~60

FIG. 7
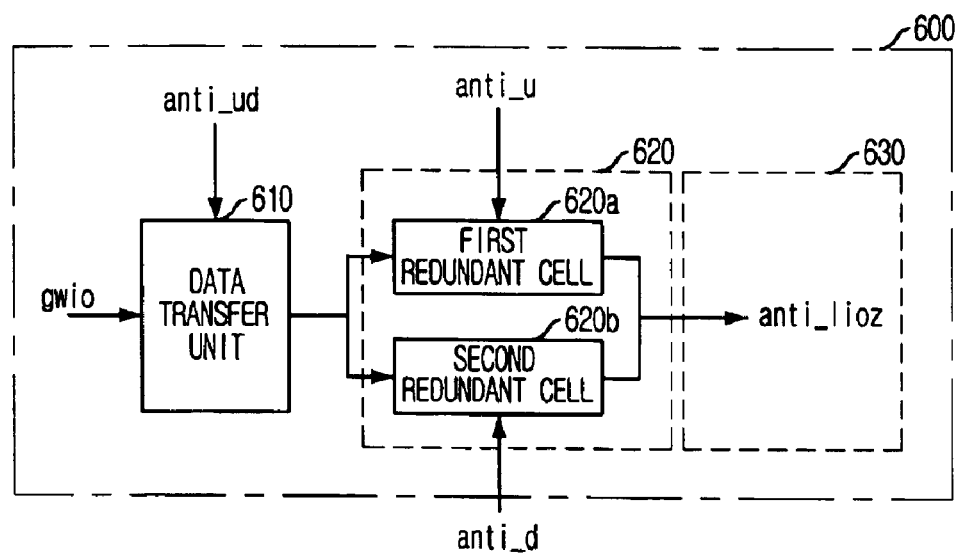
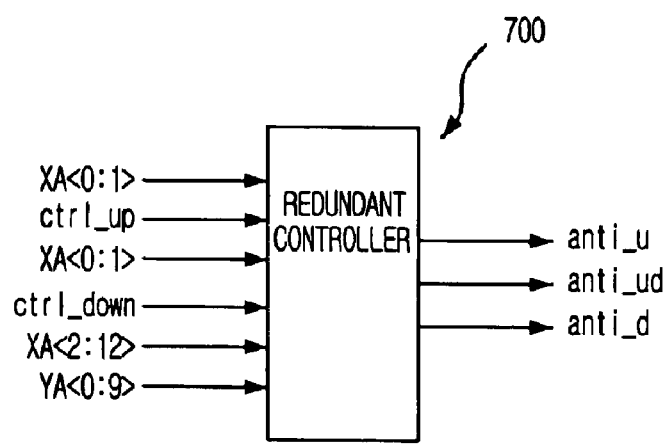

| | WORD LINE ADDRESS INCLUDING DEFECTIVE BIT | | | | | | | | | | | | | |
|---|---|---|---|---|---|---|---|---|---|---|---|---|---|---|
| | A12 | A11 | A10 | A9 | A8 | A7 | A6 | A5 | A4 | A3 | A2 | A1 | A0 | ~800 |
| wl0 | 0 | 0 | 0 | 0 | 0 | 0 | 0 | 0 | 0 | 0 | 0 | 0 | 0 | |
| wl1 | 0 | 0 | 0 | 0 | 0 | 0 | 0 | 0 | 0 | 0 | 0 | 0 | 1 | |
| wl2 | 0 | 0 | 0 | 0 | 0 | 0 | 0 | 0 | 0 | 0 | 0 | 1 | 0 | |
| wl3 | 0 | 0 | 0 | 0 | 0 | 0 | 0 | 0 | 0 | 0 | 0 | 1 | 1 | |
| | PROGRAMMING A2 TO A12 CORRESPONDING TO PRIMARY ERROR | | | | | | | | | | | SECONDARY PROGRAMMING | | |

| | DISTRIBUTION OF ERROR X-ADDRESS | POSSIBILITY OF REPAIRING DEFECTS | |
|---|---|---|---|
| 2-BIT ERROR | 401(wl0), 402(wl0) | POSSIBLE | ~900 |
| | 402(wl0), 403(wl1) | POSSIBLE | |
| | 404(wl2), 405(wl3) | POSSIBLE | |
| | 402(wl0), 405(wl3) | POSSIBLE | |
| | 403(wl1), 404(wl2) | POSSIBLE | |

…

SEMICONDUCTOR MEMORY DEVICE WITH ENHANCED REPAIR EFFICIENCY

FIELD OF THE INVENTION

The present invention relates to a semiconductor memory device; and, more particularly, to a semiconductor memory device that is capable of enhancing a repair efficiency when a detective cell is repaired using a redundant cell.

DESCRIPTION OF THE PRIOR ART

In a fabrication of a semiconductor memory device, even when only one cell among a plurality of cells is defective, the semiconductor memory device cannot perform a memory function. As a result, the semiconductor memory device is treated as a bad product. However, if the whole memory device is discarded as a bad product even when a defect occurs in only some cells of the memory device, it is very inefficient in view of yield.

Accordingly, at present, an overall memory device is repaired by replacing a defective normal unit cell using a redundancy unit cell disposed in advance in the memory device, thereby improving the yield.

According to a repair operation using the redundancy unit cell, spare rows and spare columns are in advance provided at every cell array and a defective memory cell is replaced with a redundancy memory cell based on row and column unit.

In more detail, if a detective memory cell is selected through a test after a wafer processing is completed, a program of converting the corresponding address into an address signal of the redundancy unit cell is executed in an internal circuit. Accordingly, in an actual use, the redundancy unit cell is selected when the address corresponding to the detective address is inputted.

As methods for changing an address path of a repair circuit, one method is to provide a plurality of address fuses and selectively irradiate a laser to the address fuses to thereby achieve a blowing, and another method is to provide an antifuse and applying a high voltage to both ends of the antifuse to thereby cut off the antifuse.

Although the method using the fuse can replace a detective cell with a relative small area, a test is performed at a wafer level and a laser is irradiated. Therefore, the method has a disadvantage that an error cell occurring through a package process cannot be repaired.

Accordingly, at present, the fuse is used to repair most of error cells and the antifuse is used to repair several error cells that are still in an error state even after a package.

FIG. 1 is a block diagram of a conventional memory device.

Referring to FIG. 1, the conventional memory device includes a plurality of banks 10 to 40 and each bank (e.g., 10) includes two cell blocks 11 and 12. Additionally, each bank includes a redundancy circuit for repairing detective cells, which still remain even after the package, using the antifuse. Each cell block 11 includes eight redundancy circuits 100.

Further, one redundancy circuit 100 includes two redundant cells 120, a data transfer unit 110 for storing data into the redundant cells 120, and an IO sense amplifier unit for amplifying data outputted from the redundant cells 120 to output the amplified data to an exterior. Accordingly, the memory device shown in FIG. 1 can perform the repair operation when 64(=2×16×2) detective cells occur in one back even in a package state.

FIG. 2 is a block diagram showing the repair of the detective cells using the redundant cells in the memory device of FIG. 1.

Referring to FIG. 2, if the normal cells operate without error, a word line driver 110 controls the normal cells in response to a global word line input signal gwio. In this case, data stored in a redundant cell 120a is transferred to an IO sense amplifier 130.

FIG. 3 is a circuit diagram of the redundancy circuit shown in FIG. 1.

Referring to FIG. 3, in a state that a control signal ctrl is inputted in a high level and a repair signal anti_repair is inputted in a high level, data inputted from the word line driver 110 in response to the global word line input signal gwio is transferred to the redundant cell 120a and stored therein.

At this time, if an address signal XA is in a high level, transmission gates T1 and T3 are turned on. Therefore, data inputted in response to the global word line input signal gwio is stored into a redundant cell 120a, and the data stored in the redundant cell 120a is outputted as a redundant cell output data anti_lioz to the IO sense amplifier 130.

If the address signal XA is in a low level, transmission gates T2 and T4 are turned on. Therefore, data inputted in response to the global word line input signal gwio is stored into a redundant cell 120b, and the data stored in the redundant cell 120b is outputted as the redundant cell output data anti_lioz to the IO sense amplifier 130. If the repair signal anti_repair is activated, the redundant cell output data anti_lioz is sensed and amplified.

FIG. 4 is a block diagram showing the antifuse circuit and an XA signal generator of FIG. 1.

Referring to FIG. 4, the antifuse circuit 63 includes an X-antifuse unit 63a, a Y-antifuse unit 63b, and a repair signal generator 64c.

The X-antifuse unit 63a activates a first repair signal "XA hit" if an inputted row address XA<1:12> is a repaired address. The Y-antifuse unit 63b activates a second repair signal "YA hit" if an inputted column address YA<0:9> is a repaired address. The repair signal generator 64c activates the repair signal anti_repair if the first and second repair signals XA hit and YA hit are activated.

Also, the XA signal generator 64 is enabled in response to a control signal XcntA<0> and receives the address signal XA<0> to output the XA signal.

FIG. 5 illustrates a problem occurring when a detective cell is repaired using a conventional redundant cell. Hereinafter, an operation of the conventional memory device will be described with reference to FIGS. 1 to 5.

In FIG. 5, reference numerals 201 to 205 in the normal array represent unit cells of the memory device, each of which generally consists of one capacitor and one MOS transistor.

If an error is found at one unit cell in a packaged state, row addresses A12 to A1 are inputted and programmed in order to replace the error cell using the redundant cells that are provided additionally.

In order to select the word lines w10 to w13 in FIG. 5, the word line addresses A12 to A3 are identically inputted and the word line addresses A2 and A1 are combined differently. At this time, according to the repair method using the conventional redundant cells, only the word line addresses A12 to A1 are programmed and the repair operation is performed with respect to the word line address A0 without using the antifuse.

Accordingly, if an error occurs in two adjacent unit cells corresponding to one word line, or if an error successively occurs in the word lines, the repair is possible. However, it is impossible to repair 2-bit error occurring in the word line disposed at a position in which the word line addresses A0 and A1 are changed.

In other words, in case an error occurs in the unit cells 201 and 202, or in case an error occurs in the unit cells 202 and 203, or in case an error occurs in the unit cells 204 and 205, 2-bit error can be repaired.

However, in case an error occurs in the unit cells 202 and 205 or in case an error occurs in the unit cells 203 and 204, 2-bit error cannot be repaired. In this case, the reason is because the antifuse is not used to repair the last address A0.

SUMMARY OF THE INVENTION

It is, therefore, a primary object of the present invention to provide a memory device with an enhanced repair efficiency, which is capable of performing a repair operation without regard to positions of unit cells when defective unit cells are repaired using an antifuse in a package state.

In accordance with the present invention, there is provided a semiconductor memory device including: a redundancy circuit including a plurality of redundant cells for replacing a defective normal cell, the redundant cells being activated in response to corresponding redundant cell select signals, wherein the redundancy circuit receives data in response to a repair signal and stores the data into the redundant cell selected by the redundant select signal; and a redundancy controller for activating the repair signal if the inputted addresses are repaired addresses, and for activating the redundant cell select signal for selecting one of the plurality of redundant cells according to lower-bit redundant cell select addresses corresponding to the number of the plurality of redundant cells.

BRIEF DESCRIPTION OF THE DRAWINGS

The above and other objects and features of the present invention will become apparent from the following description of the preferred embodiments given in conjunction with the accompanying drawings, in which:

FIG. 7 is a block diagram of a memory device in accordance with a preferred embodiment of the present invention;

DETAILED DESCRIPTION OF THE PREFERRED EMBODIMENTS

Hereinafter, the preferred embodiments of the present invention will be described in detail with reference to the accompanying drawings.

Figure 1:
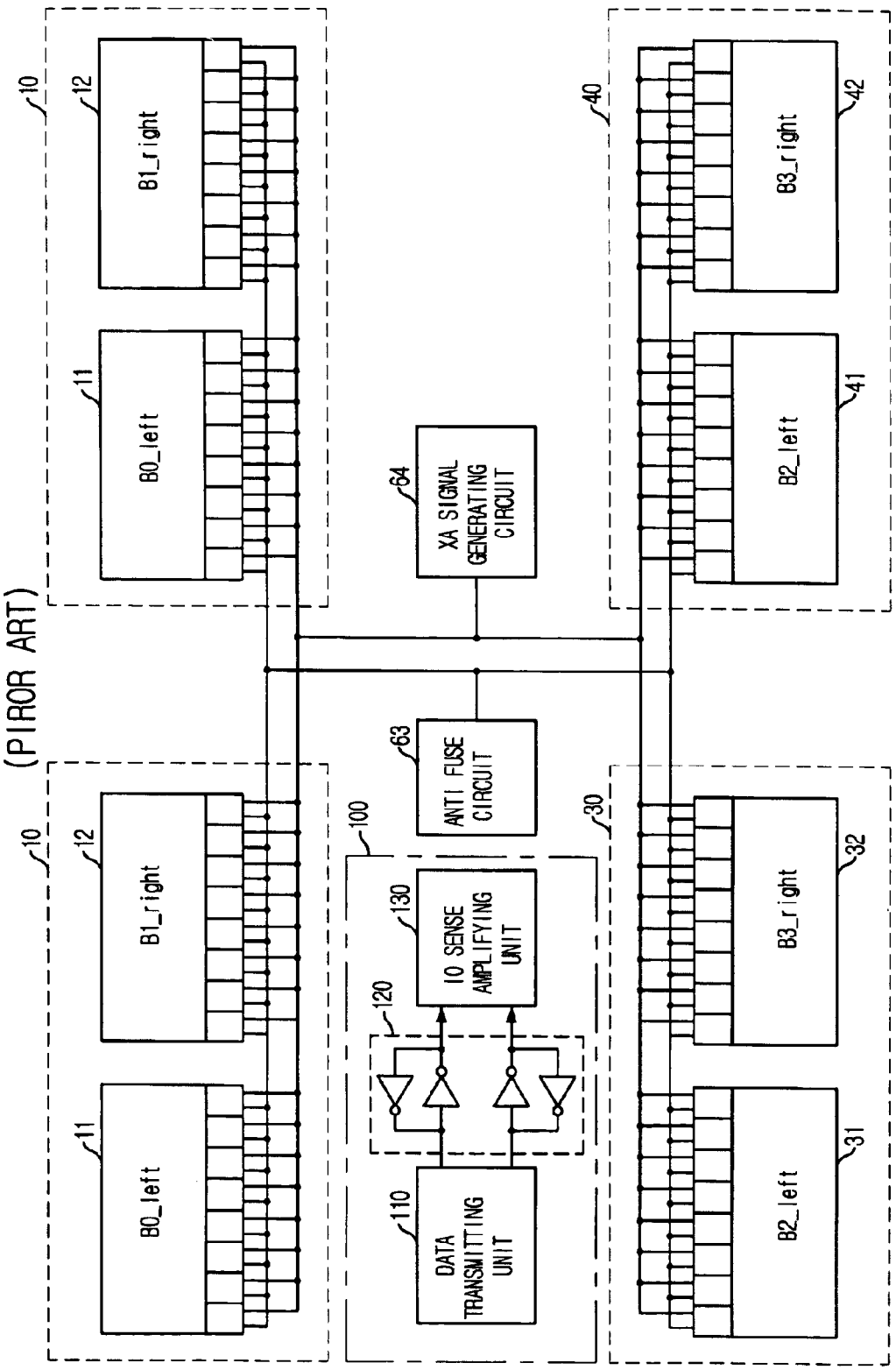
FIG. 1 is a block diagram of a conventional memory device.
Figure 2:
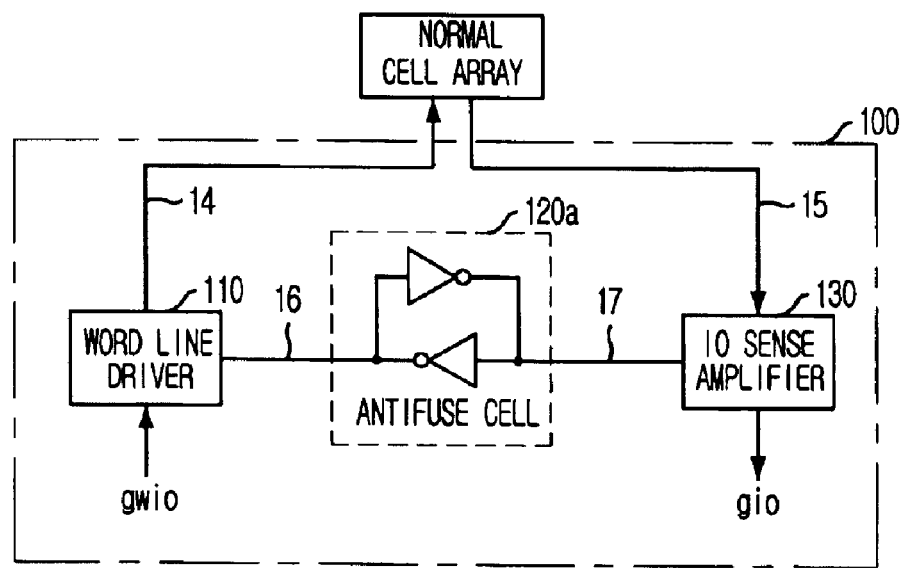
FIG. 2 is a block diagram showing a repair of a defective cell using a redundant cell in a conventional memory device of FIG. 1.
Figure 3:
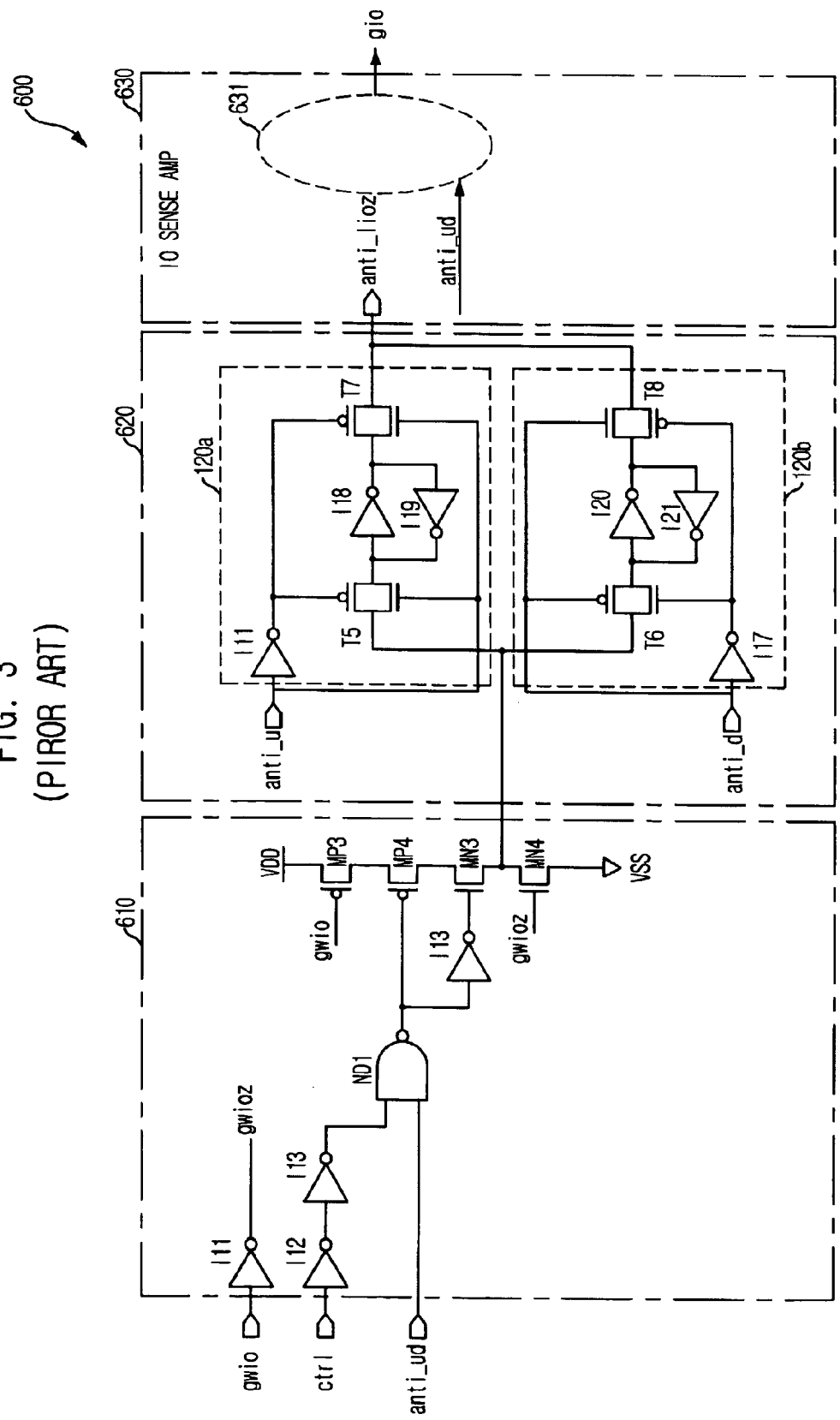
FIG. 3 is a circuit diagram of a redundancy circuit shown in FIG. 1.
Figure 4:
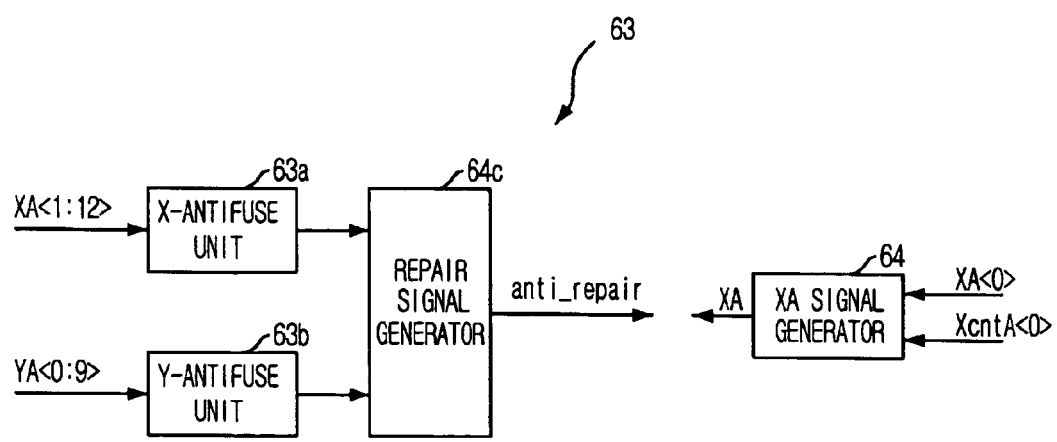
FIG. 4 is a block diagram showing an antifuse circuit and an XA signal generator in a conventional memory device of FIG. 1.
Figure 5:
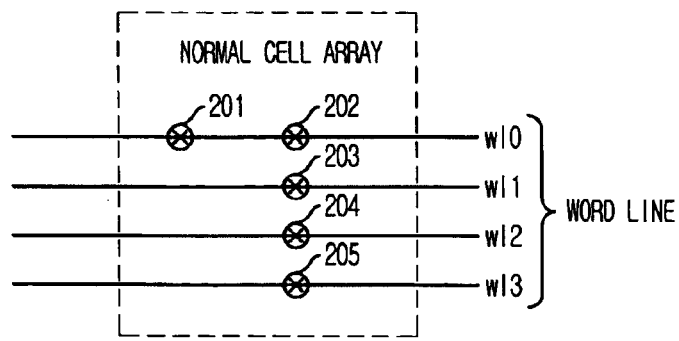
FIG. 5 illustrates a problem occurring when a detective cell is repaired using a conventional redundant cell.
Figure 6:
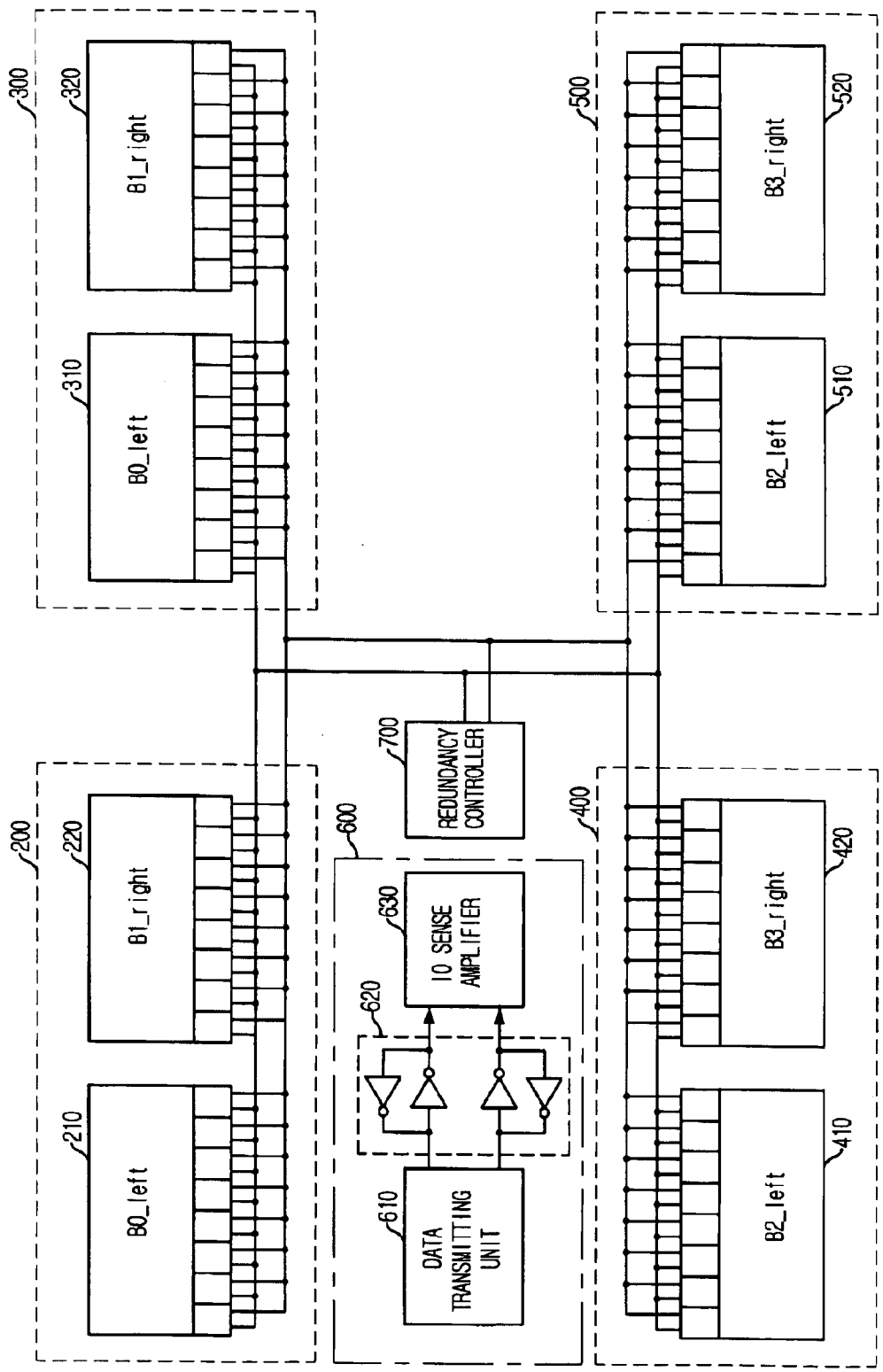
FIG. 6 is a block diagram illustrating an overall structure of a memory device in accordance with the present invention.

FIG. 6 is a block diagram of a memory device in accordance with the present invention.

Referring to FIG. 6, the memory device in accordance with the present invention includes a plurality of banks 200 to 500 and each bank (e.g., 200) includes two cell blocks 210 and 220. Additionally, each bank includes a redundancy circuit 600 for repairing detective cells, which still remain even after the package, using the antifuse. Each cell block includes eight redundancy circuits 100.

Additionally, the memory device in accordance with the present invention further includes a redundancy controller 700 for controlling the redundancy circuit 600. Here, each bank includes sixteen redundancy circuits.

FIG. 7 is a block diagram of a memory device in accordance with a preferred embodiment of the present invention.

Referring to FIG. 7, the memory device in accordance with the present invention includes a plurality of redundant cells 120a and 120b for replacing detective normal cells. The redundant cells 120a and 120b are activated in response to redundant cell select signals anti_u and anti_d, respectively. Additionally, the memory device in accordance with the present invention includes a redundancy circuit 600 and a redundancy controller 700.

The redundancy circuit 600 receives data in response to a repair signal anti_ud and stores data into the redundant cell (e.g., 120a) selected in response to the redundant cell select signals anti_u and anti_d.

The redundancy controller 700 activates the repair signal anti_ud if the inputted addresses XA<0:12> and YA<0:9> are the repaired addresses. Also, the redundancy controller 700 activates the redundant cell select signals anti_u and anti_d for selecting one of the plurality of redundant cells 120a and 120b according to lower-bit redundant cell select addresses XA<0:1> corresponding to the number of the plurality of redundant cells 120a and 120b among the addresses XA<0:12> and YA<0:9>.

Figure 8A:
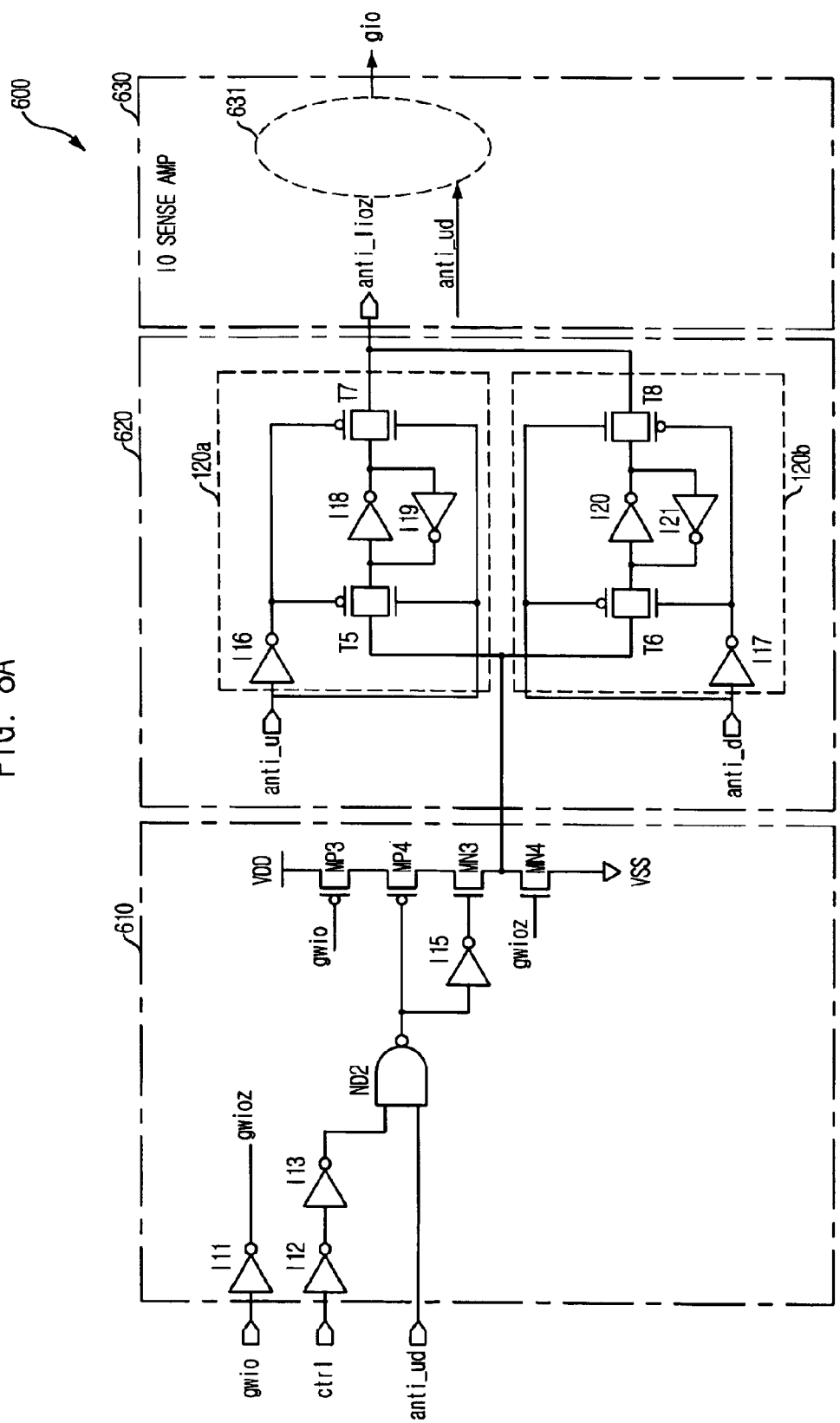
FIG. 8A is a block diagram of a redundancy circuit shown in FIG. 7.

FIG. 8A is a block diagram of the redundancy circuit shown in FIG. 7.

Referring to FIG. 8A, the redundancy circuit 600 includes a data transfer unit 610, a first redundant cell 120a, and a second redundant cell 120b.

The data transfer unit 610 receives data in response to the repair signal anti_ud and transfers the data to the selected redundant cell among the plurality of redundant cells 120a and 120b.

The first redundant cell 120a stores the data transferred from the data transfer unit 610 in response to the first redundant cell select signal anti_u, and the second redundant cell 120b stores the data transferred from the data transfer unit 610 in response to the second redundant cell select signal anti_d.

Additionally, the data transfer unit 610 includes a three-phase inverter (MP3, MP4, MN3 and MN4) which is enabled in response to the repair signal anti_ud and transfers data gwio to the first redundant cell 120a or the second redundant cell 120b.

Additionally, the first redundant cell 120a includes a first transmission gate T5 and a first latch. The first transmission gate T5 is turned on in response to the first redundant cell select signal anti_u and transfers data. The first latch consists of inverters I18 and I19 and latches the data transferred from the first transmission gate T5.

Additionally, the second redundant cell 120b includes a second transmission gate T6 and a second latch. The second transmission gate T6 is turned on in response to the second redundant cell select signal anti_d and transfers data. The second latch consists of inverters I20 and I21 and latches the data transferred from the second transmission gate T6.

Figure 8B:
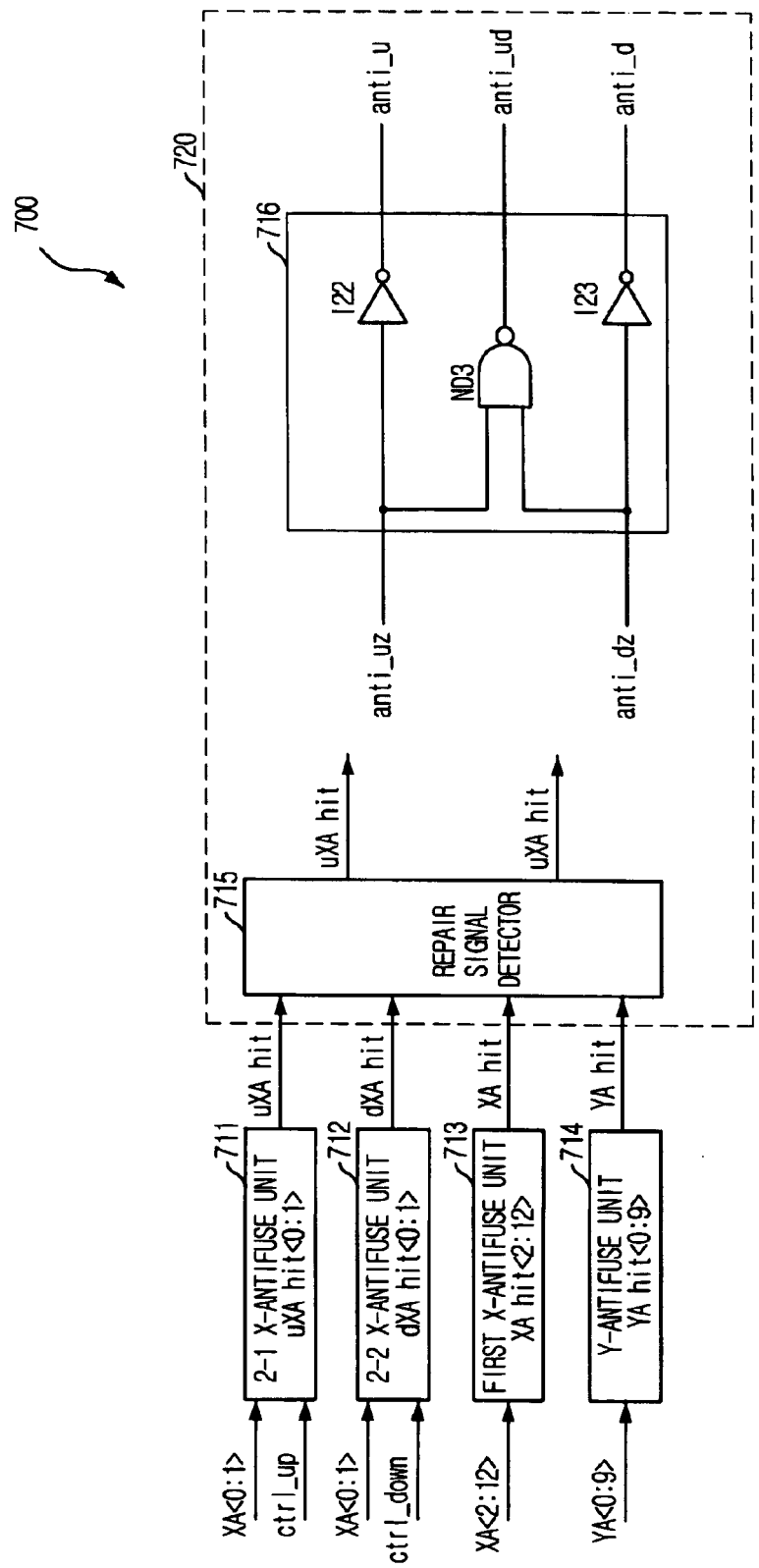
FIG. 8B is a block diagram of a redundancy controller shown in FIG. 7.

FIG. 8b is a block diagram of the redundancy controller shown in FIG. 7.

Referring to FIG. 8b, the redundancy controller 700 includes a plurality of first antifuses, a Y-antifuse unit 714, a plurality of second antifuses, a first X-antifuse unit 713, a plurality of 2-1 and 2-2 X-antifuse units 711 and 712, and a repair signal control unit 720.

The Y-antifuse unit 714 detects whether or not the column addresses YA<0:9> among the addresses XA<0:12> and YA<0:9> are addresses repaired by the selective short circuit of the first antifuses and outputs the column repair signal "YA hit".

The first X-antifuse unit 713 detects whether or not the row addresses XA<2:12> except for the redundant cell select addresses XA<0:1> among the addresses XA<0:12> are addresses repaired by the selective short circuit of the second antifuses and outputs the first row repair signal "XA hit".

The 2-1 and 2-2 X-antifuse units 711 and 712 includes third antifuses corresponding to the number of the redundant cell select addresses XA<0:1>. The 2-1 and 2-2 X-antifuse units 711 and 712 detect whether or not the redundant cell select addresses XA<0:1> are addresses repaired by the selective short circuit of the third antifuses and then output the 2-1 and 2-2 row repair signals "uXA hit" and "dXA hit".

The repair signal control unit 720 activates the repair signal anti_ud if the column repair signal YA hit and the first row repair signal XA hit are activated and one of the plurality of 2-1 and 2-2 row repair signals uXA hit and dXA hit is activated. Also, the repair signal control unit 720 activates the redundant cell select signal corresponding to the activated 2-1 row repair signal uXA hit.

The repair signal control unit 720 includes a repair signal combination unit 715 and a repair signal output unit 716.

The repair signal combination unit 715 activates one of the select signals anti_uz and anti_dz according to the activated second row repair signal if one of the 2-1 and 2-2 row repair signals uXA hit and dXA hit is activated in a state that the column repair signal YA hit and the first row repair signal XA hit are activated.

The repair signal output unit 716 activates the repair signal anti_du if one of the select signals anti_uz and anti_dz is activated, and activates the first redundant cell select signal anti_u or the second redundant cell select signal anti_d.

Figure 9:
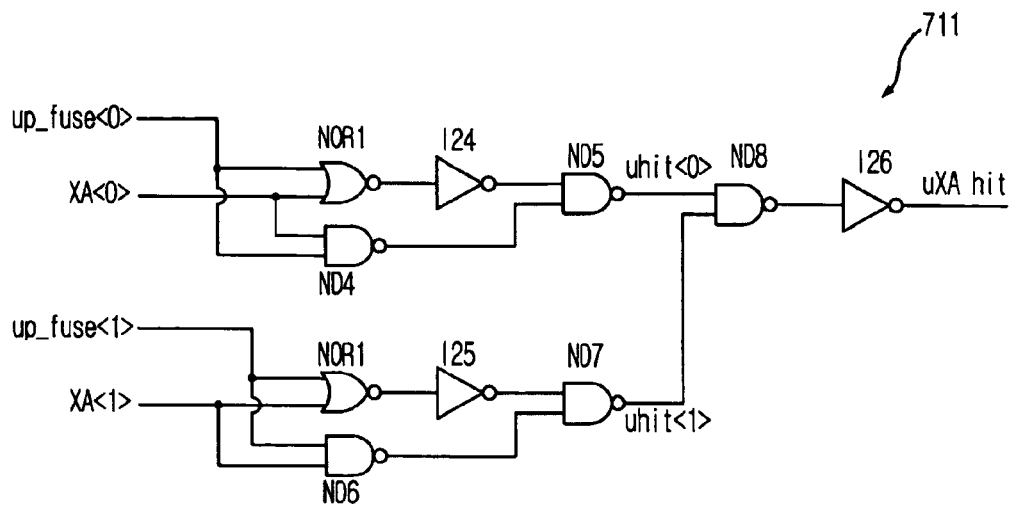
FIGS. 9 and 10 are circuit diagrams of a second X-antifuse unit shown in FIG. 8B.
Figure 10:
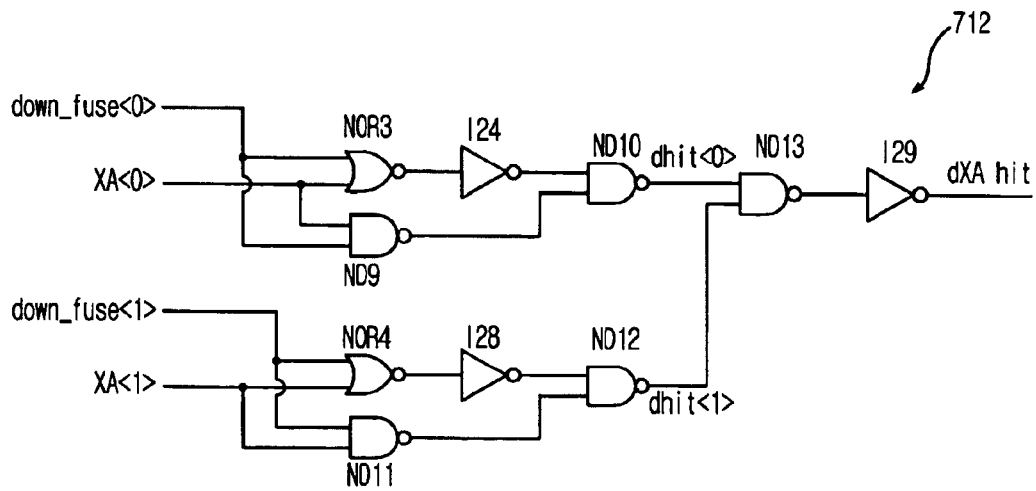

FIGS. 9 and 10 are circuit diagrams of the 2-1 and 2-2 X-antifuse units 711 and 712 shown in FIG. 8b. The 2-1 X-antifuse unit 711 of FIG. 9 is provided for controlling the first redundant cell, and the 2-2 X-antifuse unit 712 of FIG. 10 is provided for controlling the second redundant cell.

Referring to FIG. 9, the 2-1 X-antifuse unit 711 compares the redundant cell select addresses XA<0:1> and the repaired redundant cell select addresses up_fuse<0> and up_fuse<1>. If the redundant cell select addresses XA<0:1> and the repaired redundant cell select addresses up_fuse<0> and up_fuse<1> are identical to each other, the 2-1 X-antifuse unit 711 outputs the 2-1 row repair signal uXA hit for controlling the first redundant cell 120a. Here, the repaired addresses up_fuse<0> and up_fuse<1> are signals outputted by selectively shorting two antifuses (not shown).

Referring to FIG. 10, the 2-2 X-antifuse unit 712 compares the redundant cell select addresses XA<0:1> and the repaired redundant cell select addresses down_fuse<0> and down_fuse<1>. If the redundant cell select addresses XA<0:1> and the repaired redundant cell select addresses down_fuse<0> and down_fuse<1> are identical to each other, the 2-2 X-antifuse unit 712 outputs the 2-2 row repair signal dXA hit for controlling the second redundant cell 120b. Here, the repaired addresses down_fuse<0> and down_fuse<1> are signals outputted by selectively shorting two antifuses (not shown).

Figure 11:
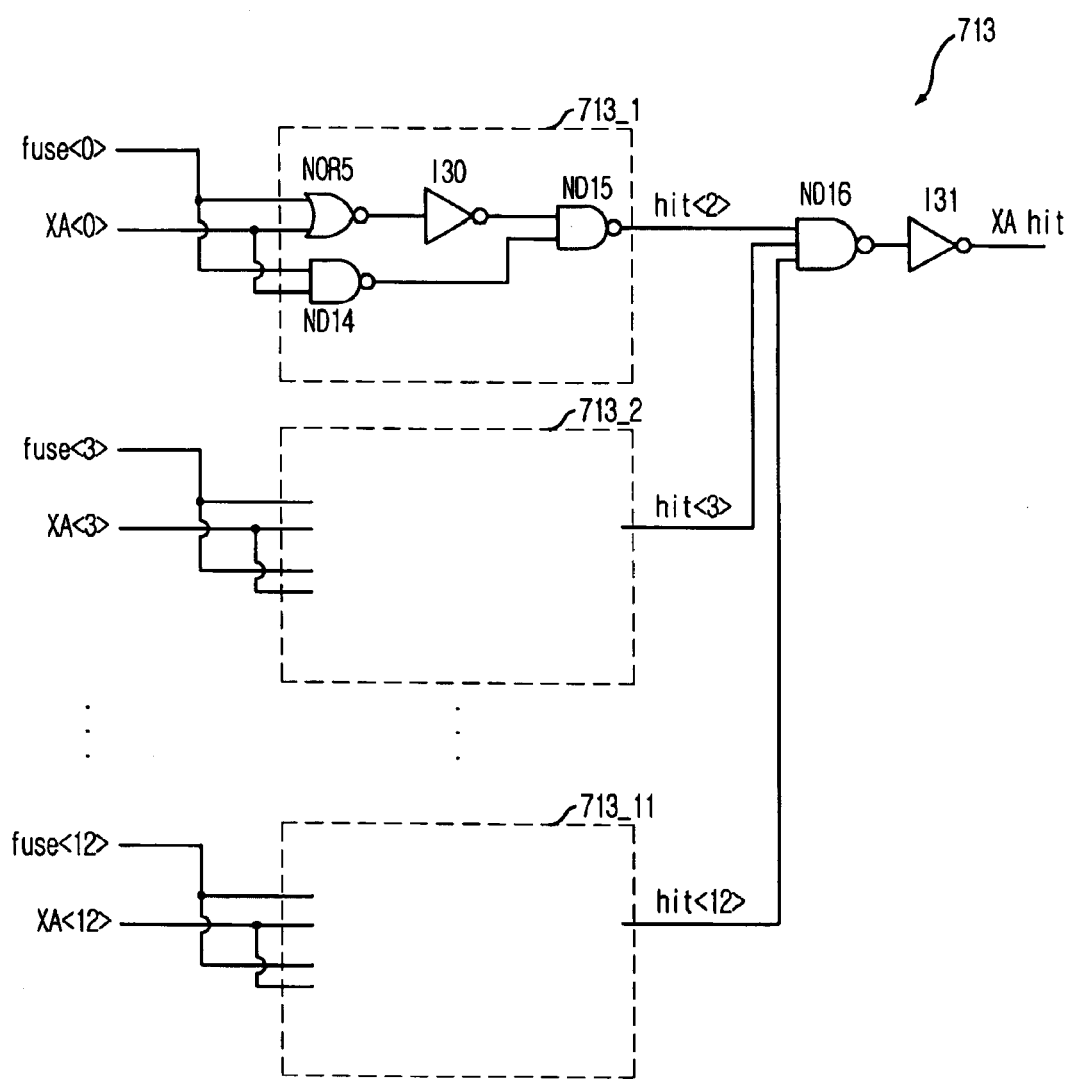
FIG. 11 is a circuit diagram of an X-antifuse unit shown in FIG. 8B.

FIG. 11 is a circuit diagram of the first X-antifuse unit 713 shown in FIG. 8b.

Referring to FIG. 11, the first X-antifuse unit 713 compares the row addresses XA<2> to XA<12> and the repaired row addresses fuse<2> to fuse<12> and activates the first row repair signal "XA hit" if all of them are identical to each other.

The Y-antifuse unit 714 of FIG. 8B has the same structure as the first X-antifuse unit 713 of FIG. 11, except that the column addresses YA<0:9> and the repaired column addresses are inputted instead of the row addresses XA<2:12> and the repaired row addresses fuse<2:12>.

The Y-antifuse unit 714 compares the column addresses YA<0> to YA<9> and the repaired column addresses and activates the first column repair signal "YA hit" if all of them are identical to each other.

Figure 12A:
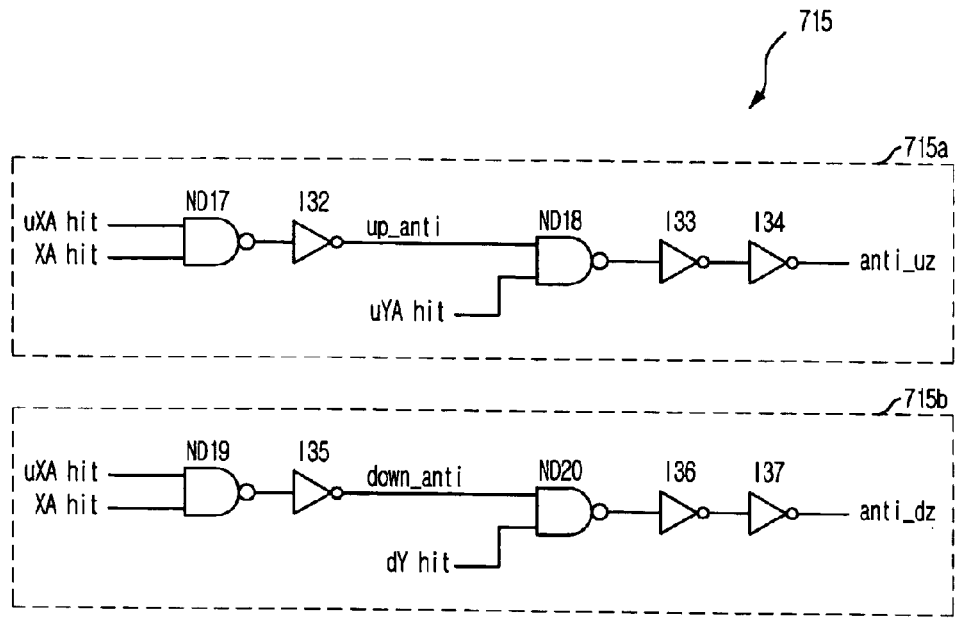
FIGS. 12A and 12B are circuit diagrams of a repair signal detector shown in FIG. 8.
Figure 12B:
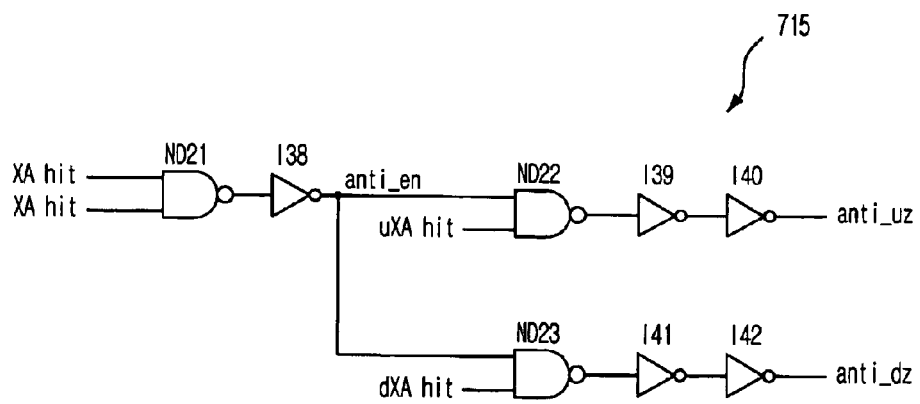

FIGS. 12A and 12B are circuit diagrams of the repair signal detector 715.

Referring to FIG. 12A, the repair signal detector 715 includes a first detector 715a for outputting the first select signal anti_uz and a second detector 715b for outputting the second select signal anti_dz.

The repair signal output unit 716 receives the first select signal anti_uz to activate the repair signal anti_ud and outputs the activated first redundant cell select signal anti_u. Also, the repair signal output unit 716 receives the second select signal anti_dz to activate the repair signal anti_ud and outputs the activated second redundant cell select signal anti_d.

The first detector 715a outputs the activated first select signal anti_uz if the 2-1 row repair signal "uXA hit" for selecting the first redundant cell 120a in a state that the first row repair signal "XA hit" and the column repair signal "YA hit" are activated.

The second detector 715b outputs the activated second select signal anti_dz if the 2-2 row repair signal "dXA hit" for selecting the second redundant cell 120b in a state that the first row repair signal "XA hit" and the column repair signal "YA hit" are activated.

FIG. 12B illustrates a repair signal detector 715 in accordance with another embodiment of the present invention. The repair signal detector 715 activates the first select signal anti__uz if the 2-1 row repair signal "uXA hit" is inputted in a state that the first row repair signal "XA hit" and the column repair signal "YA hit" are activated. Also, the repair signal detector 715 activates the second select signal anti__dz if the 2-2 row repair signal "dXA hit".

Figure 13:
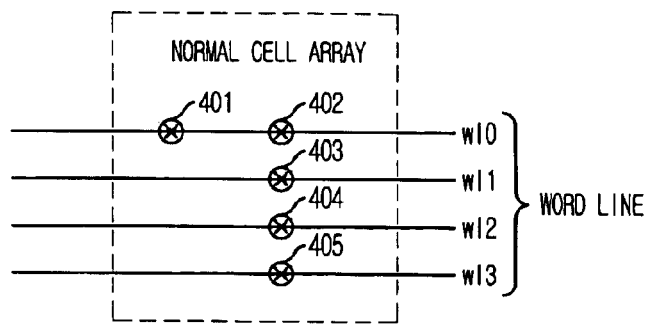
FIG. 13 is a block diagram illustrating a repair of a defective cell using a redundant cell in a memory device of FIG. 7.

FIG. 13 is a block diagram illustrating the repair of the defective cell using the redundant cell in the memory device of FIG. 7. Hereinafter, an operation of the memory device in accordance with the present invention will be described with reference to FIGS. 6 to 13.

If a defective cell is found through a test in a wafer state after a memory device is manufactured, a repair operation is performed to replace an address path in order to replace the detective cell with a redundant cell. This is achieved by irradiating laser to a plurality of address fuses provided in the repair circuit to selectively block them.

After the repair operation, a package operation is performed and then the test is again performed. If the detective cell is still found, the plurality of antifuses provided in the redundancy controller 700 are selectively cut off, thus replacing the defective cell with the redundant cell.

The Y-antifuse unit 714 of the redundancy controller 700 compares whether or not the column addresses YA<0:9> among the inputted addresses XA<0:12> and YA<0:9> are the repair address, and activates the column repair signal "YA hit" if all of them are identical to each other. Then, the Y-antifuse unit 714 outputs the activated column repair signal to the repair signal detector 715.

The first X-antifuse unit 713 of the redundancy controller 700 compares whether or not the row addresses XA<2:12> among the inputted addresses XA<0:12> and YA<0:9> are the repair address, and activates the row repair signal "XA hit" if all of them are identical to each other. Then, the first X-antifuse unit 713 outputs the activated row repair signal to the repair signal detector 715.

The first X-antifuse unit 713 and the Y-antifuse unit 714 store a plurality of repaired addresses, and activates the row repair signal "XA hit" and the column repair signal "YA hit" if the inputted address is identical to one of the plurality of stored addresses. The first X-antifuse unit 713 and the Y-antifuse unit 714 include a plurality of antifuses and store a plurality of repaired addresses according to the blowing of the antifuses.

Meanwhile, the high 11 bit addresses among the row address XA<0:12> are outputted to the first X-antifuse unit 713 and compared with the addresses repaired in the first X-antifuse unit 711. The redundant cell select addresses XA<0:1> are inputted the 2-1 and 2-2 X-antifuse units 711 and 712.

Here, the 2-1 X-antifuse unit 711 and the 2-2X antifuse unit 712 are provided for controlling two redundant cells provided in the redundancy circuit. The 2-1 X-antifuse unit 711 compares the redundant cell select addresses XA<0:1> and the stored repair addresses and activates the 2-1 row repair signal "uXA hit" if the redundant cell select addresses XA<0:1> and the stored repair addresses are identical to each other.

The 2-1 X-antifuse unit 711 includes two antifuses (not shown) and the addresses being stored are different according to the short circuit of the antifuses. Here, a control signal ctrl__up is a signal inputted into the 2-1 X-antifuse unit 711 in order for shorting the antifuses.

Additionally, an operation of the 2-2 X-antifuse unit 712 is equal to that of the 2-1 X-antifuse unit 711. A difference is that two antifuses are provided and the addresses are differently stored according to the short circuit of the antifuses.

The repair signal detector 715 activates one of the select signals anti__uz and anti__dz according to the activated signal if one of the 2-1 and 2-2 row repair signals "uXA hit" and "dXA hit" in is activated in a state that the first row repair signal "XA hit" and the column repair signal "YA hit" are activated.

The repair signal output unit 720 activates the repair signal anti__ud if one of the select signals anti__uz and anti__dz is activated, and activates the redundant cell select signals anti__u and anti__d according to the activated select signal anti__uz and anti__dz.

The redundancy circuit 600 transfers the inputted data signal gwio to the redundant cell region 620 if the repair signal anti__ud is activated.

The transmission gate T5 or T6 is turned on according to the first and second redundant cell select signals anti__u and anti__d outputted from the redundancy controller 700 and stores data transferred from the data transfer unit. Additionally, the data stored in the first or second redundant cell 120a or 120b according to the first and second redundant cell select signals anti__u and anti__d is transferred to the IO sense amplifier.

At this time, the data outputted from the first or second redundant cell 120a or 120b is transferred to the IO sense amplifier 630, and the IO sense amplifier 630 senses and amplifies the data stored in the first or second redundant cell 120a or 120b if the repair signal anti__ud is activated.

Accordingly, the memory device in accordance with the present invention detects the redundant cell select addresses XA<0:1> for selecting the ready redundant cell among the lower bits of the inputted addresses, compares whether or not they are the repaired addresses, and compares the redundant cell select addresses separately to determined whether or not they are the finally repaired addresses.

The number of the second X-antifuse units for compares the redundant cell select addresses is determined by the number of the redundant cells, and the bit number of the redundant cell select addresses is determined by the corresponding of the redundant cells to the normal unit cells.

In the above embodiment, two redundant cells are provided and the number of the second X-antifuse unit for comparing the redundant cell select addresses is "2". The bit number of the redundant cell select addresses is 2 bits because two redundant cells correspond to four unit cells. If there are four redundant cells, the number of the second X-antifuse units will be four, and if four redundant cells correspond to eight unit cells, the bit number of the redundant cell select addresses will be three.

As a result, in case two redundant cells are provided for the repair and an error occurs in 2-bit normal unit cell, it is always possible to perform the repair operation using two redundant cells without regard to the error types, as shown in FIG. 13. Thus, the yield of the memory device is increased and the productivity is improved.

Figure 14:
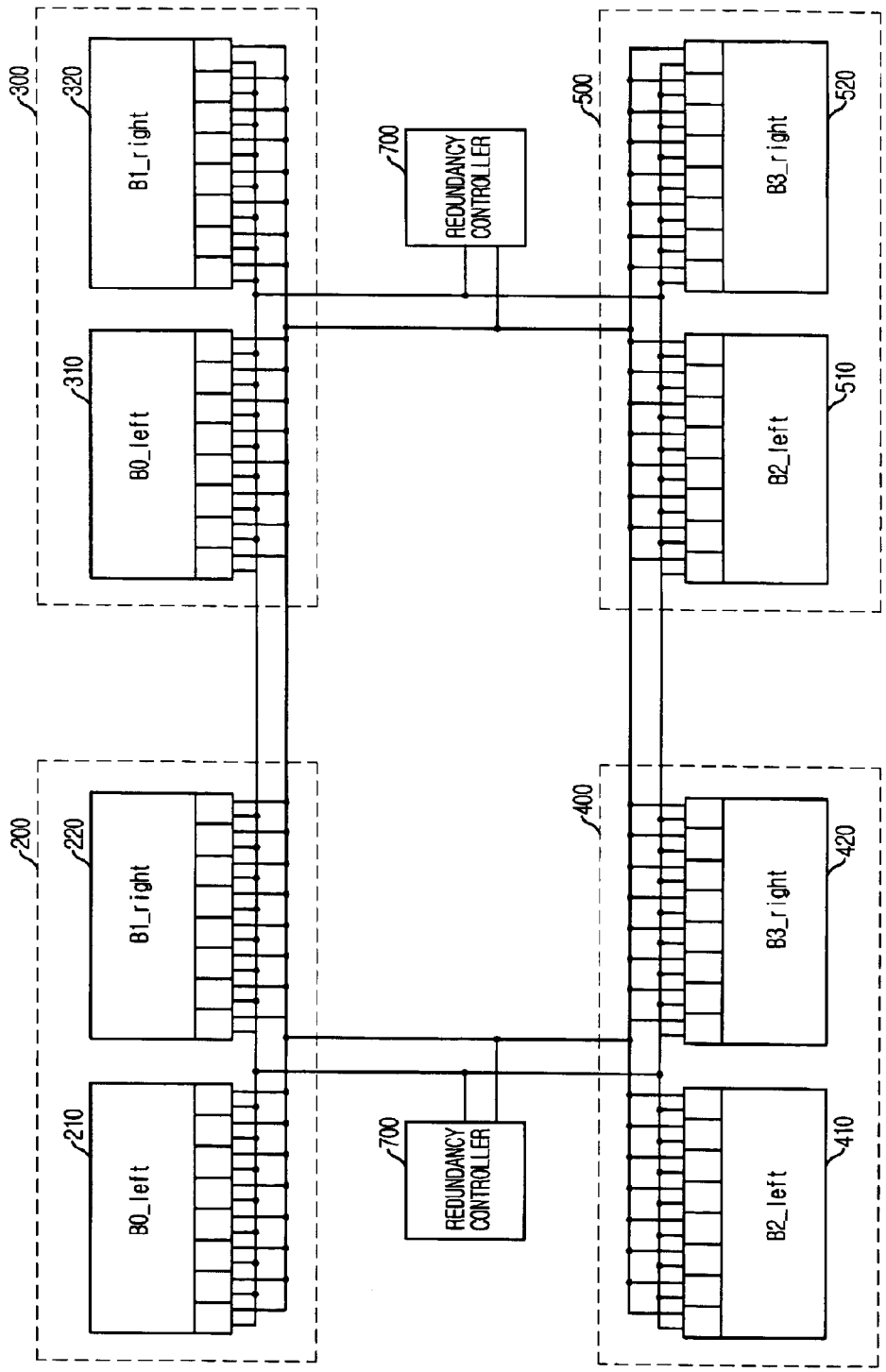
FIG. 14 is a block diagram illustrating a memory device having two redundancy controllers in accordance with the present invention.

FIG. 14 is a block diagram of the memory device having two redundancy controllers. As shown, two redundancy controllers are provided and one redundancy controller can control two banks.

In case an error occurs in the consecutive unit cells in the package state, or in case an error occurs in unit cells that are not adjacent to each other, the error cells can be repaired using the redundant cells. Therefore, the productivity of the memory device can be improved.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:

a redundancy circuit including a plurality of redundant cells for replacing a defective normal cell, the redundant cells being activated in response to corresponding redundant cell select signals, wherein the redundancy circuit receives data in response to a repair signal and stores the data into the redundant cell selected by the redundant select signal; and a redundancy controller for activating the repair signal if the inputted addresses are repaired addresses, and for activating the redundant cell select signal for selecting one of the plurality of redundant cells according to lower-bit redundant cell select addresses corresponding to the number of the plurality of redundant cells.

2. The semiconductor memory device as recited in claim 1, wherein the redundancy circuit includes:

a data transfer unit for receiving data in response to the repair signal and transferring the data to the redundant cell selected among the plurality of redundant cells;

a first redundant cell for storing the data transferred from the data transfer unit in response to a first redundant cell select signal; and a second redundant cell for storing the data transferred from the data transfer unit in response to a second redundant cell select signal.

3. The semiconductor memory device as recited in claim 2, wherein the data transfer unit includes a three-phase inverter, the three-phase inverter being enabled in response to the repair signal to transfer the data to the first or second redundant cell.

4. The semiconductor memory device as recited in claim 3, wherein the first redundant cell includes:

a first transmission gate being turned on in response to the first redundant cell select signal to transfer the data; and a first latch for latching the data transferred from the first transmission gate.

5. The semiconductor memory device as recited in claim 4, wherein the second redundant cell includes:

a second transmission gate being turned on in response to the second redundant cell select signal to transfer the data; and a second latch for latching the data transferred from the second transmission gate.

6. The semiconductor memory device as recited in claim 1, wherein the redundancy controller includes at least one antifuse.

7. The semiconductor memory device as recited in claim 1, wherein the redundancy controller includes:

a Y-antifuse unit including a plurality of first antifuses, for detecting whether or not column addresses among the addresses are addresses repaired by a selective short circuit of the first antifuses and outputting a column repair signal;

a first X-antifuse unit including a plurality of second antifuses, for detecting whether or not row addresses except for the redundant cell select addresses among the addresses are addresses repaired by a selective short circuit of the second antifuses and outputting a first row repair signal;

a plurality of second X-antifuse units corresponding to the plurality of redundant cells and including third antifuses, the number of the third antifuses corresponding to the redundant cell select addresses, for detecting whether or not the redundant cell select addresses are addresses repaired by a selective short circuit of the third antifuses and outputting a second row repair signal; and a repair signal control unit for activating the repair signal if the column repair signal and the first row repair signal are activated and one of the plurality of second row repair signals is activated, and for activating the redundant cell select signal corresponding to the activated second row repair signal.

* * * * *